(12) United States Patent
Deptuch

(10) Patent No.: US 9,437,771 B2
(45) Date of Patent: Sep. 6, 2016

(54) MONOLITHIC ACTIVE PIXEL RADIATION DETECTOR WITH SHIELDING TECHNIQUES

(71) Applicant: Grzegorz W. Deptuch, Forest Park, IL (US)

(72) Inventor: Grzegorz W. Deptuch, Forest Park, IL (US)

(73) Assignee: Fermi Research Alliance, LLC, Batavia, IL (US)

( * ) Notice: Subject to any disclaimer, the term of this patent is extended or adjusted under 35 U.S.C. 154(b) by 350 days.

(21) Appl. No.: 13/893,514

(22) Filed: May 14, 2013

(65) Prior Publication Data

US 2016/0155879 A1    Jun. 2, 2016

(51) Int. Cl.
*H01L 31/113* (2006.01)
*H01L 31/18* (2006.01)
*H01L 31/115* (2006.01)

(52) U.S. Cl.
CPC ............ *H01L 31/18* (2013.01); *H01L 31/115* (2013.01)

(58) Field of Classification Search
None
See application file for complete search history.

(56) References Cited

U.S. PATENT DOCUMENTS

| | | | |
|---|---|---|---|
| 5,625,210 A | 4/1997 | Lee et al. | |
| 5,841,159 A | 11/1998 | Lee et al. | |
| 5,904,493 A | 5/1999 | Lee et al. | |
| 6,027,955 A | 2/2000 | Lee et al. | |
| 6,034,407 A | 3/2000 | Tennant et al. | |
| 6,118,846 A | 9/2000 | Liu | |
| 6,229,191 B1 | 5/2001 | Cao et al. | |
| 6,934,050 B2 * | 8/2005 | Merrill et al. | .... H01L 27/14647 250/208.1 |
| 7,923,673 B2 | 4/2011 | Büttgen et al. | |
| 2007/0012970 A1 * | 1/2007 | Mouli | .............. H01L 27/14603 257/292 |
| 2009/0212197 A1 | 8/2009 | Buttgen et al. | |

* cited by examiner

*Primary Examiner* — Ha Tran T Nguyen
*Assistant Examiner* — Jordan Klein
(74) *Attorney, Agent, or Firm* — Kermit D. Lopez; Luis M. Ortiz; Ortiz & Lopez, PLLC

(57) ABSTRACT

A monolithic active pixel radiation detector including a method of fabricating thereof. The disclosed radiation detector can include a substrate comprising a silicon layer upon which electronics are configured. A plurality of channels can be formed on the silicon layer, wherein the plurality of channels are connected to sources of signals located in a bulk part of the substrate, and wherein the signals flow through electrically conducting vias established in an isolation oxide on the substrate. One or more nested wells can be configured from the substrate, wherein the nested wells assist in collecting charge carriers released in interaction with radiation and wherein the nested wells further separate the electronics from the sensing portion of the detector substrate. The detector can also be configured according to a thick SOA method of fabrication.

10 Claims, 14 Drawing Sheets

MONOLITHIC ACTIVE PIXEL RADIATION DETECTOR WITH SHIELDING TECHNIQUES

STATEMENT OF GOVERNMENT RIGHTS

The invention disclosed in this application was made with Government support under the Fermi Research Alliance, LLC, contract Number DE-AC02-07CH11359 awarded by the U.S. Department of Energy. The Government has certain rights in the invention.

FIELD OF THE INVENTION

Embodiments are generally related to radiation detectors. Embodiments are also related to SOI (Silicon-on-Insulator) devices and fabrication methods thereof. Embodiments additionally relate to front-end electronic circuits.

BACKGROUND

Semiconductor based devices, or sensors, for detecting electromagnetic radiation or fluxes of ionizing particles are known in the art. These sensors are implemented in a semiconductor substrate in an IC (Integrated Circuit) technology such as a MOS (Metal Oxide Semiconductor), CMOS (Complementary Metal Oxide Semiconductor), or CCD (Charged Coupled Device) technology utilizing, for example, so-called collection junctions, which are regions adapted for collecting charge carriers generated in the substrate by the electromagnetic radiation and which are either pn- or np-junctions.

Semiconductor based detectors for detecting ionizing radiation, such as X-rays, generally are based on indirect conversion detector techniques. In an indirect conversion detector, for example, a scintillation device is applied in which the ionizing (X-ray) radiation hitting the scintillation device causes emission of electromagnetic radiation that has different wavelengths with respect to the incoming radiation. This electromagnetic radiation enters the semiconductor substrate where it generates charge carriers that are subsequently detected by, for example, the collection junctions. Direct detection methods, which do not require intermediary scintillator are preferred, however, limitations often result from insufficient absorption in too thin active layers or from degradation of detector performances due to radiation damages.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide for an improved radiation detector.

It is another aspect of the disclosed embodiments to provide for a monolithic active pixel radiation detector capable of being implemented via a variety of shielding techniques.

It is yet another aspect of the disclosed embodiments to provide for a radiation detector structure based on a configuration of nested wells.

It is yet another aspect of the disclosed embodiment to provide for a radiation detector structure based on the use of a thick, impervious silicon layer located on an isolation oxide and the use of a partially depleted SOI (Silicon-on-Insulator) process.

The aforementioned aspects and other objectives and advantages can now be achieved as described herein. A monolithic active pixel radiation detector is disclosed, including a method of fabricating thereof. In general, the disclosed radiation detector can include a substrate comprising a silicon layer upon which electronics are configured. A plurality of channels can be formed on the silicon layer, wherein the plurality of channels are connected to sources of signals located in a bulk part of the substrate, and wherein the signals flow through electrically conducting vias established in an isolation oxide on the substrate. One or more nested wells can be configured from the substrate, wherein the nested wells assist in collecting charge carriers released in interaction with radiation and wherein the nested wells further separate the electronics from the sensing portion of the detector substrate. In the case of a thick Silicon layer, separation can be provided by the bottom part of this layer, which can be kept at a fixed potential similar in manner to the nested wells.

The detector with nested wells can be fabricated in a SOI (Silicon-on-Insulator) process with a thin silicon layer that is used for building of the front-end electronic circuits and with a thin separation oxide. The thickness of these layers can be referred to as "thin" regarding the penetration of dopants to create nested wells in the substrate. The electronic channels can be connected to sources of signals located in a bulk part of a wafer, which involves flow of signals through electrically conducting vias established in the isolation oxide.

The essence of at least some of the disclosed embodiments is the introduction of a structure of nested wells that has at least three roles: first, a role of collection of charge carriers released in interaction with radiation; second, a role of assurance of electrical separation of two closely spaced regions (i.e., the electronics and the sensor part one from each other); and third, a role of a reduction of difference of potential in the oxide between the electronics layer and the substrate, thus decrease of charge trapping in oxide to improve radiation hardness.

In another embodiment, the detector with thick silicon layer can be fabricated in a SOI process, in which the thickness of the silicon layer for electronics is increased so that partially depleted SOI or bulk equivalent integrated circuit processing could be performed. The electronic channels are connected to sources of signals located in a bulk part of a wafer, which involves flow of signals through electrically conducting vias established in the isolation oxide. The vias are isolated from ubiquitous silicon with junctions. The essence of at least one of some of the disclosed embodiments is the introduction of an opaque silicon layer in which transistors of signal processing electronic circuits are located and continuity of this layer assures shielding between the electronics and the sensor components.

The disclosed embodiments offer an efficient way of extending a standard process of fabrication of integrated circuits on SOI wafers with a high-resistivity bulk layer for building monolithic pixel detectors. It should be noted that the use of the present invention manifests its advantage mainly by the fact that it provides a highly desirable minimum effort (thus cost efficiency) required to the adaptation of a process for the fabrication of integrated circuits in order to obtain an efficient radiation detector.

The use of the nested wells approach allows retaining all steps of fabrication of electronics unchanged with respect to the original process. By this means, processing of monolithic radiation detectors and standard electronics is achievable on the same process line. The only difference consists in addition of a few implantation steps and establishing of contacts through the isolation oxide. The technology of monolithic pixel detectors fabricated with nested wells is applicable for position sensitive detectors, intensity radiographic imaging detectors and timing and energy spectroscopic detectors in, for example, High Energy and Nuclear Physics, Photon Science, Material Science, Nuclear Medicine, etc.

In some embodiments, the nested wells can be configured as a respective pair of a deep Buried P(N)-type Well BPW(BNW) implanted in a handle part of a Silicon-on-Insulator (SOI) process wafer to collect charge carriers, and a shallow Buried N(P)-type Well BNW(BPW) nested by implantation inside the first well to inhibit capacitive coupling between the electronics and the sensor part by connecting this nested well to a low impedance constant voltage source. In other embodiments, depending on the type of bulk conductivity, execution of nesting of wells may be interchanged (e.g., BNW in BPW or BPW in BNW).

On an N-type sensor embodiment, BPW and BNW are deep and shallow implantations, respectively. On a P-type sensor embodiment, implants are reversed. This feature is marked by appropriately interchangeably placing the names of wells in parentheses in the earlier text. If at any point throughout the remainder of the document, reference is made to only one topology, for example, to the implementation of nested wells on the N-type sensor embodiment, analogous implementation, the ability to automatically reverse the type of the wells is also considered for the P-type sensor embodiment. The goal for nested wells is to achieve decoupling of the electronics and charge-sensing region of a detector. Buried Oxide (BOX) or a single well, being originally the only isolation in monolithic pixel sensors, which were realized so far in SOI processes, is not enough.

The active volume of the sensor with nested wells operates with electric field that is induced between the back plane of a sensor and an array of deep wells. The shallow well is placed just under the BOX and it is an AC-ground plane, tied to a fixed potential in operation of a detector. Thus, the back-gate effect on transistors is suppressed, no interference is transmitted from the electronics to the sensors active volume, resistance to ionizing radiation of the device is increased by assuring virtually no electric field in the BOX region and the full volume of the detector can be operated in depletion. The deep well, responsible for charge collection, is implanted using sufficient energy of the implanter, suitable for doping species, to create a peak of concentration deeply in the sensors as far from the BOX as achievable.

The depth of implantation for the nested wells structures can be selected to avoid too large lateral spread of the doping. The latter is necessary in order not to compromise isolation of adjacent charge collecting electrodes. The deep implantation of the charge-collecting electrode leaves net doping concentration at the BOX boundary unchanged. Selection of exact values of energies for ion implantations obviously needs to be specified in a given process rules to allow design of mask. However, due to the general aspect of the invention, the energies need not be exactly specified herein. That is, their choice only has to take into account the optimization of the structure of the detector in the context of a particular application.

The shallow implantation of the shielding well (e.g., nested inside the deep well) requires formation of encompassing walls of the same type as the deep implant in order to avoid shortening of the nested wells to the sensor bulk, as the nested well is of the same conductivity type as the bulk. The junction isolation walls, embracing tightly the shallow well, result from multi-step implantations carried at varied energies each and energies decrease towards the surface. Typically two or three (in general case multiple) selective implantation steps are required to enclose the shallow wells by the deep wells. The implantations, used for establishing enclosures of the shallow wells, are used for assuring connections between the electronics in the Silicon layer on top of the BOX and the charge collecting electrodes (deep wells). Connections to the deep and shallow wells are established by fabricating through BOX contacts filled with metal.

Note that in another embodiment, a radiation detector can be configured according to a thick isolation processing technique based on the use of silicon on top of a high resistivity handle wafer. A detector created according to this technique can use a thick layer directly from the vendor or it can be grown epitaxially or achieved by other means. A blanket implantation can be performed of one type or a doping of one type can be achieved during epitaxial growth (doping sufficient to implement one type of transistor). Other steps involve the implantation of one or more islands by converting the conductivity type to embed transistors of the second type in these islands. Some areas of the first type can be left around places for contacts (to be cut) to establish connections to diodes in the substrate.

Additionally, doping of islands of the second conductivity type can be performed in such a manner that every contact through isolation oxide to sources of signals is encircled by thus created junction to form isolation of contacts. Other processing steps involve performing cuts of contacts and implantation within cavities (e.g., starting with thin Silicon implants of collecting junctions before epitaxial growth). Cavities can be filled with metal establishing ohmic contacts to collection junctions and flow of signals to the electronics. Electronics can be configured with, for example, partially depleted SOI transistors or literally bulk-like behaving transistors.

BRIEF DESCRIPTION OF THE FIGURES

The accompanying figures, in which like reference numerals refer to identical or functionally similar elements throughout the separate views and which are incorporated in and form a part of the specification, further illustrate the embodiments and, together with the detailed description, serve to explain the embodiments disclosed herein.

DETAILED DESCRIPTION

Figure 1:
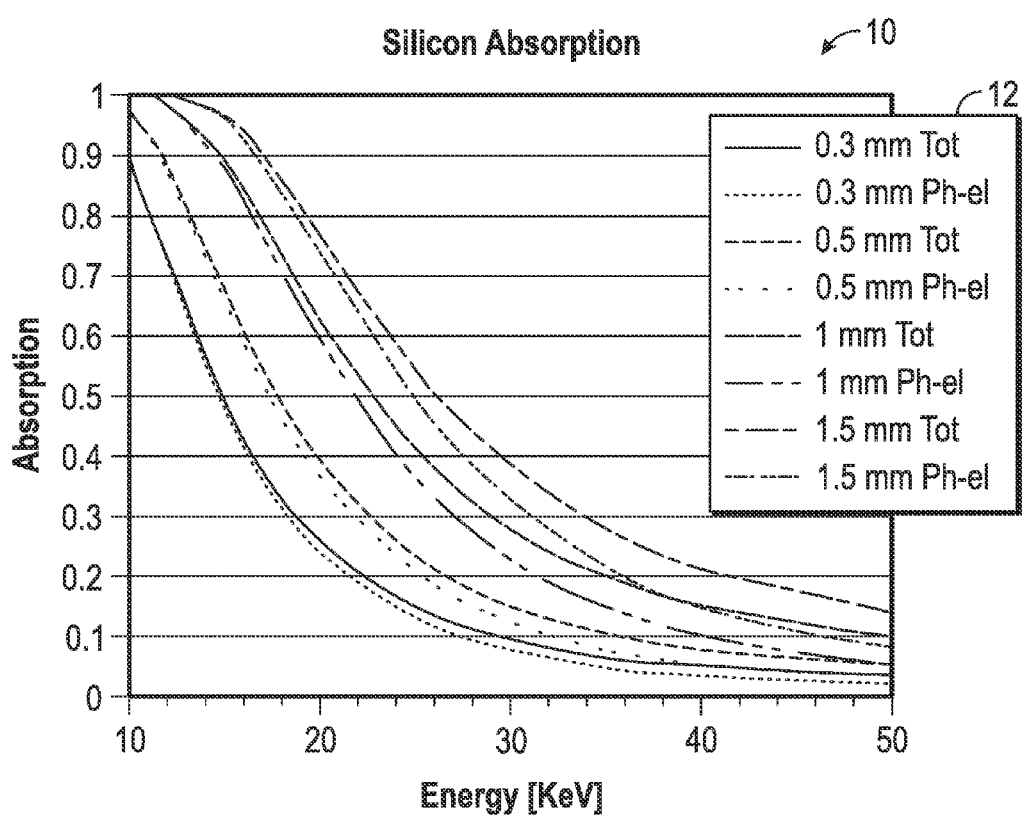
FIG. 1 illustrates a graph depicting data indicative of the absorption of X-rays in Silicon as a function of energy and thickness of the detector material.

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Silicon on Insulator (SOI) process may be seen as particularly well adapted for detectors. Thanks to the SOI, truly integrated sensor with electronics is possible. A detector, which is referred to as a system combining functions from sensing the radiation to provide processed data, can be built as a monolithic structure. No bump bonding or other post-fabrication bonding technique is needed. Moreover, all fabrication steps can be accomplished in one place, e.g., a commercial foundry.

In general, a SOI detector can employ Silicon as radiation-to-charge conversion medium. The nature of the SOI process yields lightweight detectors. Although, there is no need of bump bonding as a means of assembly, post fabrication may still be needed to target back-thinning, back-side implantation and annealing (i.e., depending on what is a target application; X-ray science, for example, usually prefers thick detectors). Note that post fabrication is independent of the procedures described herein. Last but not least, although a SOI device may be already a fully operational detector in its initial form; additional processing power can be added in some cases by stacking additional layers through 3D (Three-Dimensional) semiconductor processing. That is, a three-dimensional integrated circuit (e.g., 3D IC, 3D-IC, or 3-D IC) is a chip in which two or more layers of active electronic components are integrated both vertically and horizontally into a single circuit. Wafers originating from a SOI lane, for example, can be processed with such 3D semiconductor fabrication techniques.

Silicon detectors in a SOI process are selective with respect to applications that can be targeted. Such detectors may be ideal for applications, where minimum scattering is desired (e.g., charged particle tracking in High Energy Physics or direct electron imaging in electron microscopy in material science), and where energy range is suitable (e.g., soft X-rays detection in synchrotron radiation, X-ray fluorescence and limited medical use). A silicon detector in the context of SOI, for example, requires special attention for assuring radiation hardness, and can be addressed through a proper range of X-ray energies and back-side illumination to avoid charging of buried oxide (BOX).

FIG. 1 illustrates a graph 10 depicting data indicative of the absorption of X-rays in silicon as a function of energy and thickness of the detector material. Legend 12 is associated with the data lines plotted in graph 10. Absorption of X-rays in silicon as a function of energy and thickness of the detector material is thus shown in graph 10 in FIG. 1. The efficiency drastically drops above 15 keV. But what is even worse, radiation damage becomes a significant issue above this level. Other approaches for alleviating radiation damage, although more difficult in practice, is to quantify and counter-react to shifts of parameters (e.g., walk of discrimination thresholds). Generally, a very careful approach for shielding mutually detector and electronics is required. This is even more inevitable in pixels built on gain stages.

Active Pixel Sensors realized in a SOI process (SOIAPS) stand between two other pixel detector technologies, i.e. Monolithic Active Pixel Sensors (MAPS) and Hybrid Active Pixel Sensors (HAPS). MAPS are intrinsically monolithic and cheap through the use of a CMOS process that in principle can be standard, commercial one. MAPS can cover large areas through reticle stitching and offer radiation hardness. MAPS are not adequate for any X-rays and achieving extensive in-pixel electronics is extremely difficult and thus processing of signals in MAPS is limited, unless technological fabrication process that is used for manufacturing of MAPS receives significant modification—meaning departure from standard features. On the other hand, HAPS are good for X-rays and this is the technology dominating solid-state detectors in applications in X-ray science. It is possible to cover high X-ray energy region through use of high atomic-number materials as detection medium in HAPS. Detector and electronics can be independently optimized and ultimate radiation hardness is achieved. Weak points are large material budget and costs linked to the hybridization. It is also difficult to build large area detectors in the hybrid technology without using 3D techniques, for example, due to placement of pads.

Figure 2:
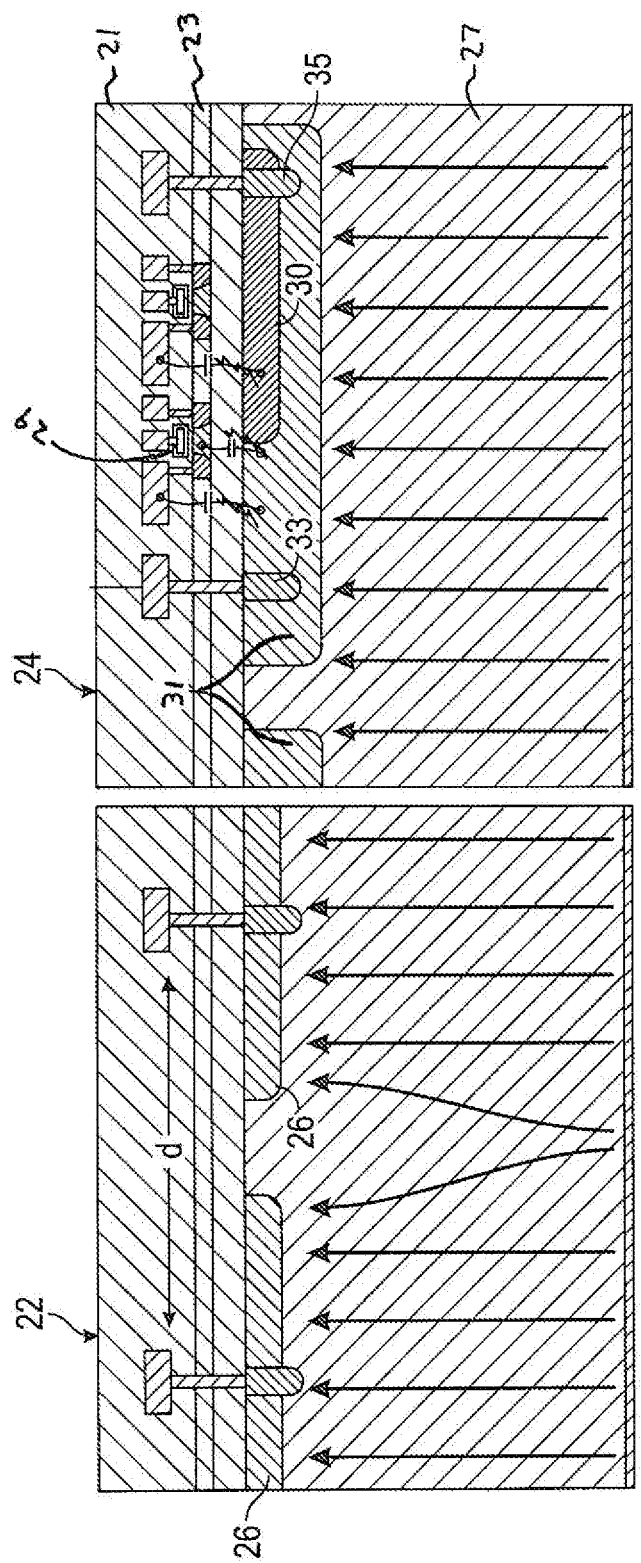
FIG. 2 illustrates schematic diagrams depicting the use of BPW (and nested BNW-BPW wells in a SOI process.

FIG. 2 illustrates schematic diagrams 22 and 24 respectively depicting the use of BPW and nested BNW-BPW wells in an SOI process. Aggregated layers 21 are shown in FIG. 2 composed of dielectric material constituting isolation between metallization layers utilized for interconnections in the processing of detector signals. FIG. 2 further illustrates a transistor 29 built in a layer of silicon on top of dielectric isolation buried oxide as part of the signal processing circuit of the detector. A thin layer 23 of silicon can also be used for building transistors. Layer 25 shown in FIG. 2 is a dielectric isolation layer of buried oxide (BOX). Layer 31 constitutes a line of the first layer metallization in the pixel processing circuit that receives charge signals from the detector through a via passing through the buried oxide layer and a high concentration doping region used for ohmic contacts 33 shown in diagram 24 in FIG. 2. Layer 27 shown in FIG. 2 constitutes an n(p) type material of the detector that is a source of the charge signals collected by the detector diode electrodes after a full or partial depletion. Layer 30 constitutes BNW.

Schematic diagram 22 indicates the use of BPW 26 only. Schematic diagram 24 shows both BNW-BPW wells 30 (BNW 30 nested inside BW P 26) with respect to BPW wells 26. The configuration shown of schematic diagram 24 is thus based on nested BNW-BPW wells. When using a single well (BPW), an electric potential under any circuitry may be kept constant or change very little. BPW typically results in increased charge-to-voltage conversion node capacitance (which is unwanted). BPW may provide perfect removal of the back-gating for circuits located outside the matrix of pixels. It may be used inside pixels; however it is not adequate for every concept of pixel architecture. This may function with charge integrating pixels (three transistor type or integrating pixels) under certain conditions related to the implementation of the readout, but generally it cannot be used as a standalone shield as it would compete in charge collection.

Charge injections due to electronics activity may be canceled out by sequential readout with exactly repeated patterns for control signals and Correlated Double Sampling (CDS). In this scheme, the use of only BPW may be satisfactory. On the other hand, nested BPW-BNW wells provide full isolation of the electronics and the detector charge collection nodes regardless of any readout methodology. This is because the electric potential under any circuitry is kept constant as BNW should be connected to an AC ground. Designs employing amplification stages and digital blocks are possible with nested wells. Grounded BNW underneath the whole electronics removes paths of parasitic feedbacks that can lead to instabilities in the system composed of multiple stages and digital parts, e.g., counters. The downside of the nested BPW-BNW solution is an increase of the input capacitance of a charge sensitive node (collecting node) by a capacitance of the BPW-BNW junction. The junction is shallow and biased at low voltage.

The injection of charge in a pixel may have multiple origins. The strongest charge injections occur during swinging digital control lines and switching on and off transistors in digital circuits. Charge injections occur through parasitic capacitances present in the circuit. Intra pixel and inter pixels injection paths exist. The dangerous injections are to the nodes on which charge freed in radiation events is collected. Note that the tabs 33, 35 shown in the right hand side of FIG. 2 represent high concentration doping for ohmic contacts. The inserts tabs 33, 35, for example, are located at the ends of vias passing through BOX.

Figure 3:
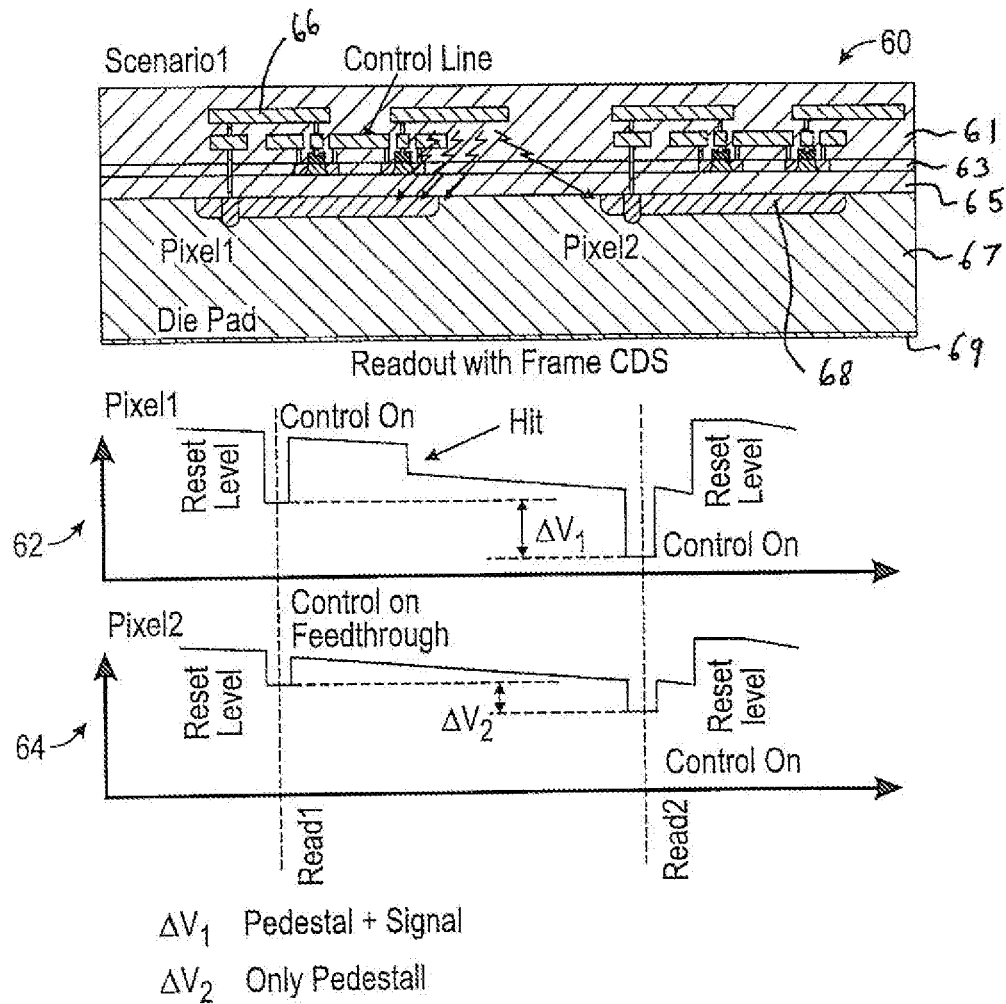
FIG. 3 illustrates a schematic diagram depicting injection of charge from a digital control line to BPW regions constituting anodes of detector diodes.

FIG. 3 illustrates a schematic diagram 60 depicting injection of charge from a digital control line to BPW regions constituting anodes of detector diodes. Layers 61 shown in FIG. 3 are aggregated layers of dielectric material constituting isolation between metallization layers used for interconnections in the processing circuit of detector signals. Layer 63 constitutes a layer (thin) of silicon utilized for building transistors. Layer 65 constitutes a dielectric layer of buried oxide (BOX). Layer 66 is a metallization line that brings charge signals to transistors that constitute the signal processing circuitry of a pixel. Layer 67 shown in FIG. 3 is an n(p) type material of the detector that is the source of charge signals collected by the detector diode electrodes after a full or partial depletion Layer 68 shown in FIG. 3 is a shallow buried p(n) well that is merged with anodes (cathodes) or that constitutes anodes (cathodes) of detector diodes for the n (p)-type of the detector material. Layer 69 shown in FIG. 3 is a metallic (Schottky) or junction contact on the back side of the detector.

An illustration of the operation of a pixel with BPWs, forming anodes of the detector diodes, is thus shown in FIG. 3. The situation presented in FIG. 3 represents a readout operation following a reset. During activation of readout (control ON), the result voltage from a pixel can be sampled and during a second activation of readout (control ON again), the second sample can be employed to calculate the final result as a difference of two samples (i.e., principle of Correlated Double Sampling in imagers). All contributions that are present in both samples (e.g., interferences from activation of controls) can be then cancelled out. Graph 62 tracks a process of reset, control on, occurrence of hit and then control on, reset with respect to a voltage difference $\Delta V_1$ which is the result obtained after subtraction. Graph 64 tracks a process of reset, control on, feedthrough and control on followed by reset with respect to a voltage difference $\Delta V_2$, which is the result of the subtraction of samples originating from another pixel to which controls are coupled. Note that "controls on" can be linked to readouts of levels from pixels. Additionally, $\Delta V_1$ and $\Delta V_2$ shown in FIG. 3 are the results of the subtraction of two readouts from two pixels/channels.

Injection of charge from a digital control line to a collecting node occurs dominantly inside a pixel, but some of the injected charge may get to neighbors. It is assumed that a pixel is a simple charge integrating one, for example, representing the popular 3-transistor (3T) architecture (integrating pixel). The device can thus operate in a frame-integrating mode, and subtracting two results can be equal to Correlated Double Sampling. Typically, pixel signals are subtracted from two consecutive frames. If two frames are taken after resetting of charge collecting nodes in pixels and if all switching activity occurs repeatedly in both frames at the same respective times and of exact strengths, the net results after subtraction may be zeroed. A fraction of the signal from one pixel, however, may be induced in another, pixels will not be cancelled. Exemplary waveforms of charge integrating devices are shown in FIG. 3. It is assumed that a control line changes its state for a short time during which readout of a pixel is performed.

Figure 4:
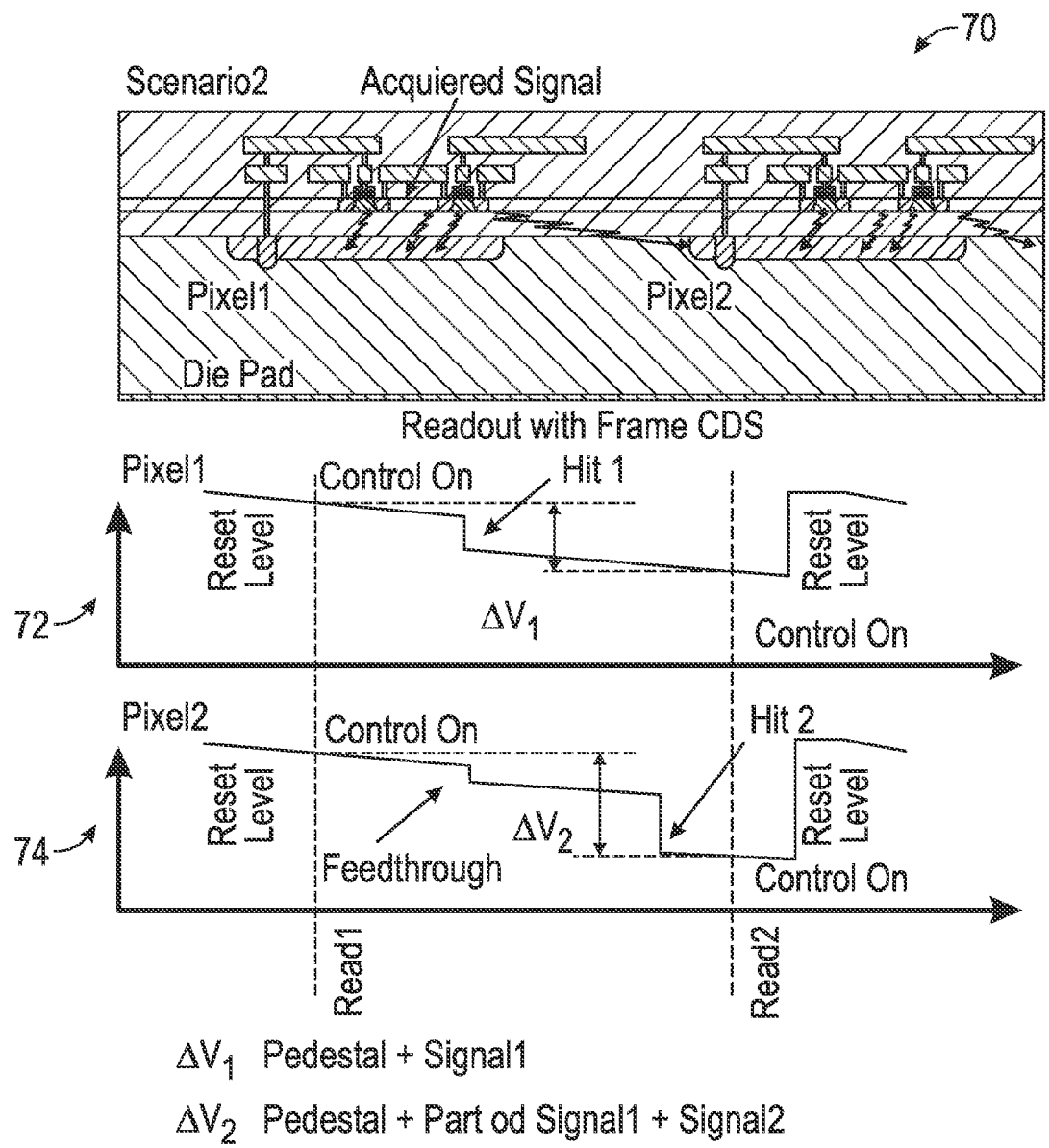
FIG. 4 illustrates a schematic diagram depicting injection of charge from an in-pixel amplifier, for example, from a source follower to BPW regions constituting anodes of detector diodes.

The continuous drop of voltage results from accruing of leakage current charges and signals from radiation events are overlaid on this drop. It can be noticed that even large charge injection that is in the first frame is subtracted only if it is present in the second frame in the same proportion/magnitude. After subtracting pedestals that are mainly due to the leakage current and common injections, actual signals are visible. Thus, it can be concluded that BPWs can be used in a simple designs of integrating pixels. Nevertheless, there may be some impact on the operation, leading to excess noise. Accumulated charges from detection of radiation change voltages in some nodes of the electronics. These nodes may capacitively couple to the neighboring sensitive nodes causing occurrences of false magnitudes of signals or causing fake signals. Such a situation is depicted in FIG. 4, which illustrates a schematic diagram 70 depicting injection of charge from an in-pixel amplifier, for example, from a source follower to neighboring BPW regions constituting anodes of detector diodes. Occurrence of the second hit (hit2) may have its magnitude falsely read out as some part of the first hit (hit1) from neighboring pixel coupled to it. FIG. 4 also depicts a graph 72 that tracks a process of reset, control on (readout 1), occurrence of hit1, and then control on (second readout), reset with respect to a voltage difference $\Delta V_1$. Graph 74 tracks a process of reset, control on (readout 1), feedthrough of part of hit1, occurrence of hit2, and control on (readout 2), reset with respect to a voltage difference $\Delta V_2$.

For the sake of the example depicted in FIG. 4, two pixels receive signals but due to asymmetries of layouts, the signal from the first pixel (hit1) induces some image in the second pixel. This injection of charge from an in-pixel amplifier, for example, from a source follower cannot be corrected by processing with Correlated Double Sampling, thus it is seen as an excess noise in the readout. Injections of charge from multi-stage in-pixel amplifiers and digital circuitry, for example, in-pixel discriminators and counters operated in continuous mode are instantaneous and may originate in different parts of the circuit. These effects are uncontrollable and may have adverse results on stability of the system. An illustration of such situations is depicted in FIG. 5, where, for example, changes in values stored in in-pixel counters induce detectable signals in the same pixel or in neighbors.

Figure 5:
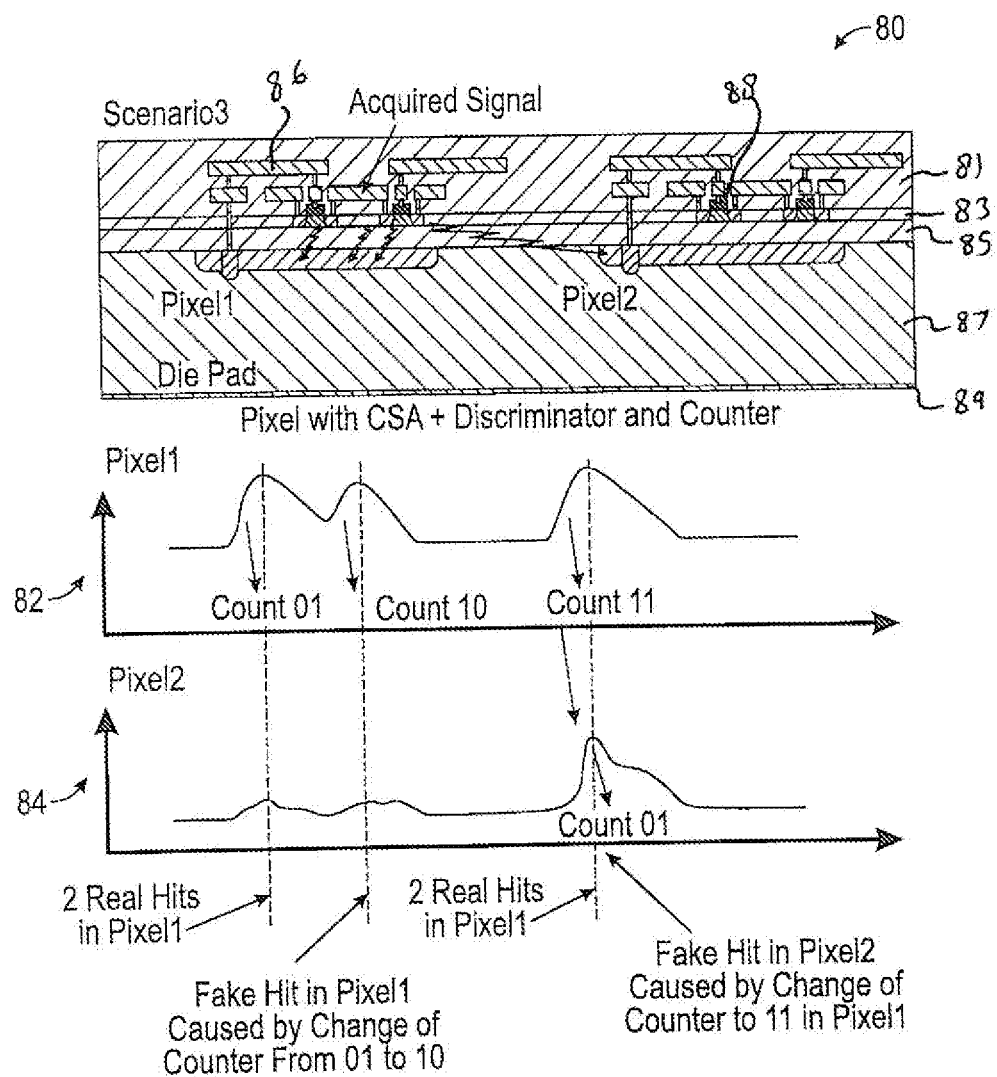
FIG. 5 illustrates a schematic diagram depicting injection of charge from a multi-stage in-pixel amplifier and digital circuitry operated in continuous mode to BPW regions constituting anodes of detector diodes.

FIG. 5 illustrates a schematic diagram 80 depicting injection of charge from a multi-stage in-pixel amplifier and digital circuitry operated in continuous mode to BPW regions constituting anodes of detector diodes. Layer 86 shown in FIG. 5 is a metallization line, bringing charge signals to transistors that constitute the signal processing circuitry of a pixel. Layer 88 depicted in FIG. 5 forms part of the transistor built in the layer of silicon on top of dielectric isolation buried oxide part of the signal processing circuit of the detector. Layer(s) 81 comprises aggregated layers of dielectric material constituting isolation between metallization layers utilized for interconnections in the detector processing circuit. Layer 83 shown in FIG. 5 is a layer (thin) of silicon used for building transistors. Layer 85 constitutes a dielectric isolation layer of buried oxide (BOX). Layer 87 depicted in FIG. 5 comprises an n(p)-type material of the detector that is the source of charge signals collected by the detector diode electrodes after a full or partial depletion. Layer 89 shown in FIG. 5 comprises a metallic (Schottky) or junction contact on the backside of the detector.

Graph 82 shown in FIG. 5 tracks (i.e., as an example of any digital activity) data indicating count 01 through count 10 and count 11. Graph 84 of FIG. 5 tracks data indicative of coupling noise in pixel 2 and through count 01. Graphs 82 and 84 indicate two real hits in pixel 1 and a fake hit in pixel 1 caused by a change of a counter to 01. Additionally, graphs 82 and 84 depict data indicating a fake hit in pixel 2 caused by a change of a counter to 11 in pixel 1. FIGS. 3, 4 and 5 thus demonstrate how interferences may disturb the operation of an SOI detector and indicate how only single BPW is inefficient in dealing with these interferences.

Figure 6:
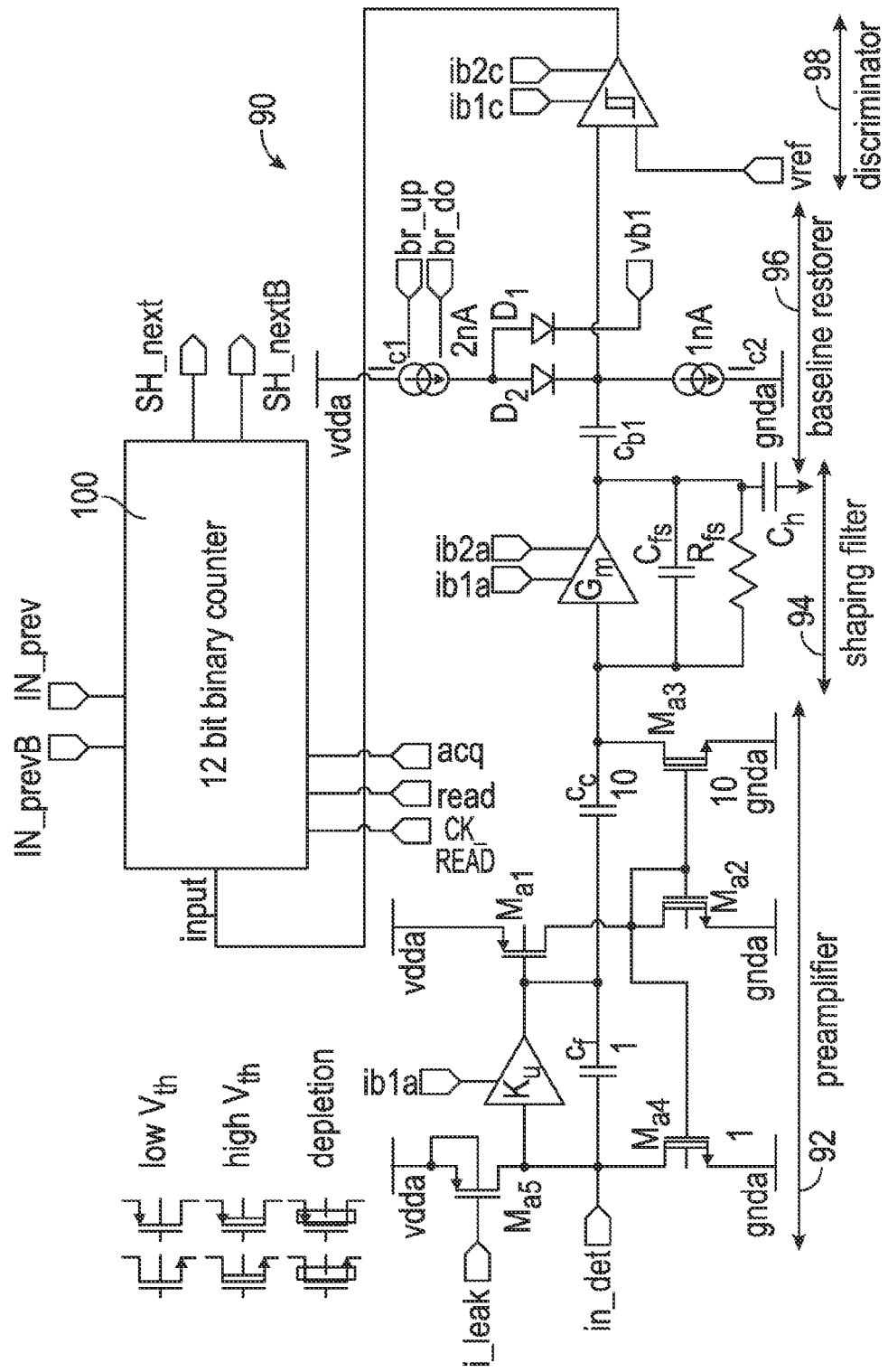
FIG. 6 illustrates a simplified schematic diagram of a processing chain of a charge signal in a SOI detector using typical signal processing blocks in nuclear electronics such as, for example, a preamplifier, shaping filter, baseline restorer, comparator or comparators and counters for registering events and compatible with a structure exploiting nested wells.

FIG. 6 illustrates a simplified schematic diagram 90 of a processing chain of a charge signal in a SOI detector using typical signal processing blocks in nuclear electronics such as, for example, a preamplifier, a shaping filter, a baseline restorer, a comparator or comparators, and counters for registering events. These components are compatible with the nested wells. The pixel features a charge sensitive amplifier 92, a shaping filter 94, a baseline restorer 96, a discriminator 98, and a binary ripple counter 100, in this case 12 bit binary counter.

Figure 7:
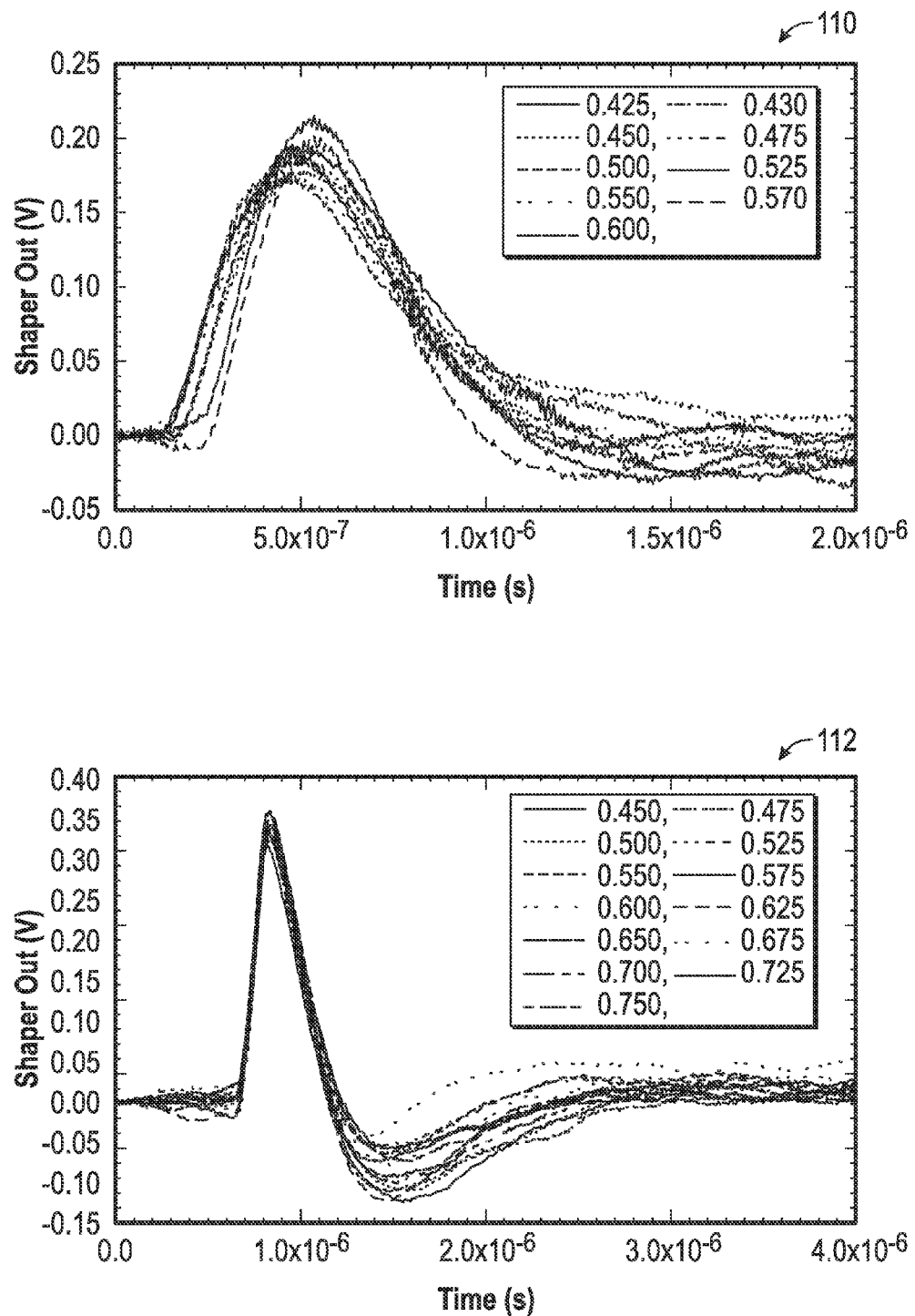
FIG. 7 illustrates graphs depicting examples of data indicative of the monitoring of shaper and discriminator outputs (transient signals) for $^{55}$Fe and $^{109}$Cd radioactive sources.
Figure 7:
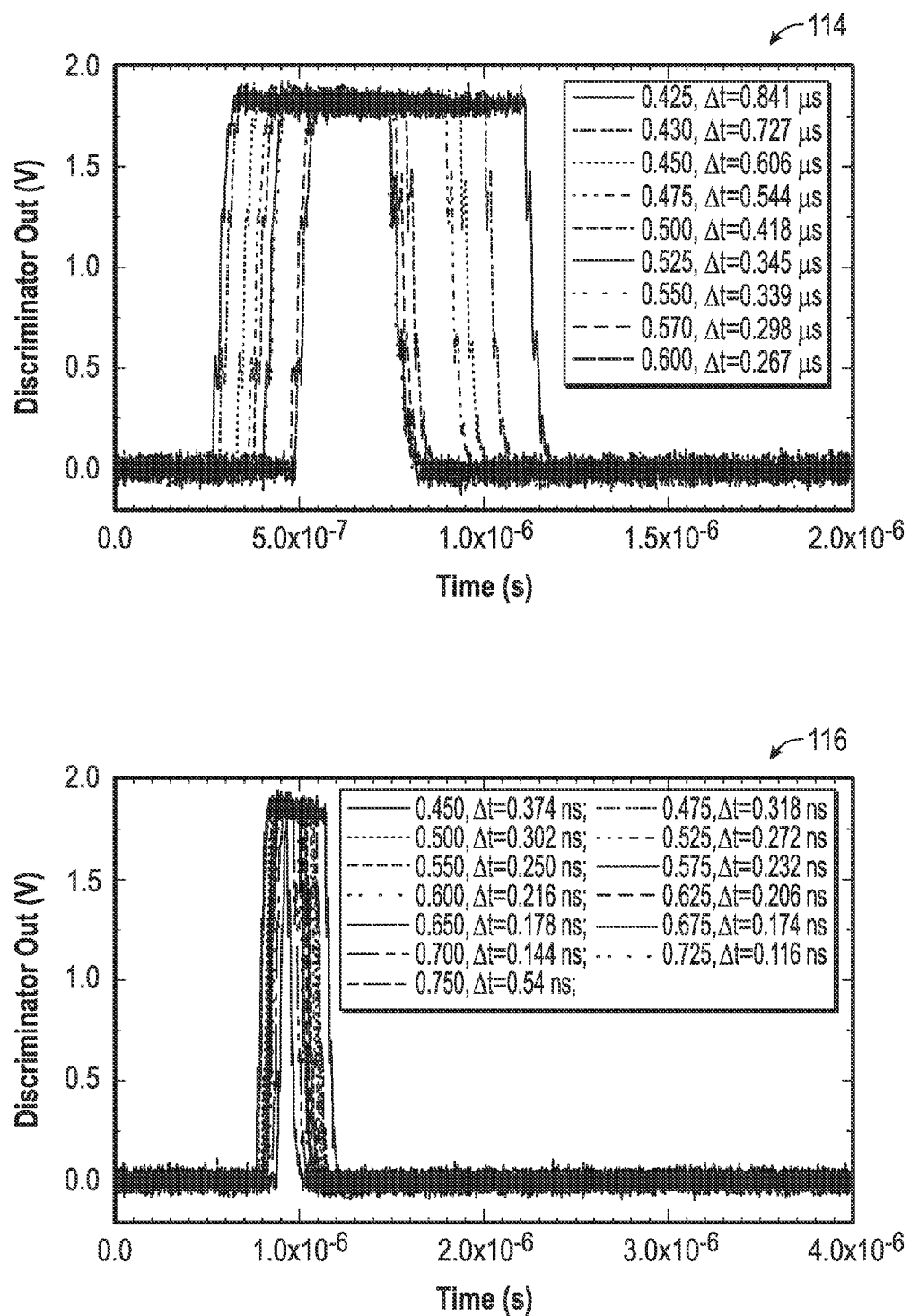

FIG. 7 illustrates example graphs 110, 112, 114, 116 depicting examples of waveforms indicative of the shaper and discriminator outputs (transient signals) for $^{55}$Fe and $^{109}$Cd radioactive sources. Examples of monitoring (e.g., registering) of the shaper and discriminator outputs (e.g., transient signals) for $^{55}$Fe and $^{109}$Cd radioactive sources (note that many other sources of X-rays can be used) are thus shown in the graphs depicted in FIG. 7. Discriminators can be examined at varied thresholds. The discriminators are able to deliver triggering signals to counters. Note that the detector could not be depleted to obtain these results, as depletion results in an exacerbation of interferences. Mainly, these results (obtained on a single channel not with a matrix of pixels) seemed to be sufficient. A closer look at the qualitative and quantitative aspects of the results, however, reveals discrepancies (not shown and not discussed here). The measured counting rates as a function of the detector bias did not follow expected trends. The discriminators were triggering at levels showing obvious dependence on the detector bias and some instabilities in circuit operation has been observed.

Figure 8:
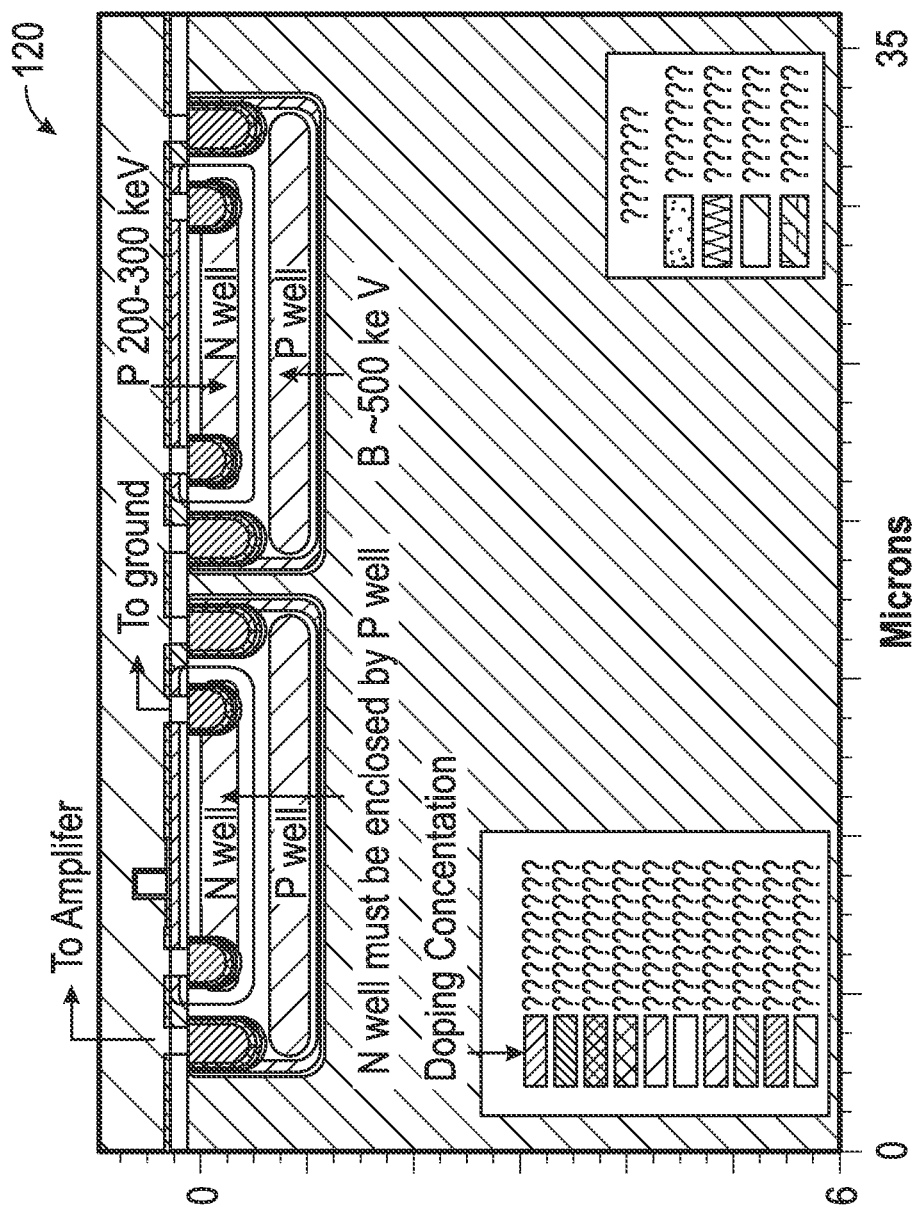
FIG. 8 illustrates a schematic diagram illustrating the concept of nested BPW-BNW simulated by the a process simulator and which provides example data for energies of implementations of wells in accordance with a particular embodiment.

The concept of a nested BPW-BNW is shown in the schematic diagram 120 shown in FIG. 8, which illustrates a schematic diagram illustrating the concept of nested BPW-BNW simulated by the a process simulator and which provides example data for energies of implantations of wells in accordance with a particular embodiment. It can be appreciated that the values depicted in FIG. 8 (e.g., 200-300 keV, 500 keV, etc.) are merely example values and are not considered limiting features of the disclosed embodiments but are provided merely for edification and exemplary purposes only. FIG. 8 thus depicts the nested BPW-BNW configuration simulated using a process simulator, in accordance with a preferred embodiment.

FIG. 8 shows the results of simulations that can be obtained with any computer program capable of handling implantation, diffusion, annealing models, etc. The actual implementation may rely on another set of simulation data conveyed at the foundry, but it is expected to follow closely the results obtained via the process simulator discussed above. Note that the doping energies and concentrations shown in FIG. 8 are for reference only. A well working structure can be obtained with other values trading, for example, pixel spacing for depth of doping.

Figure 9:
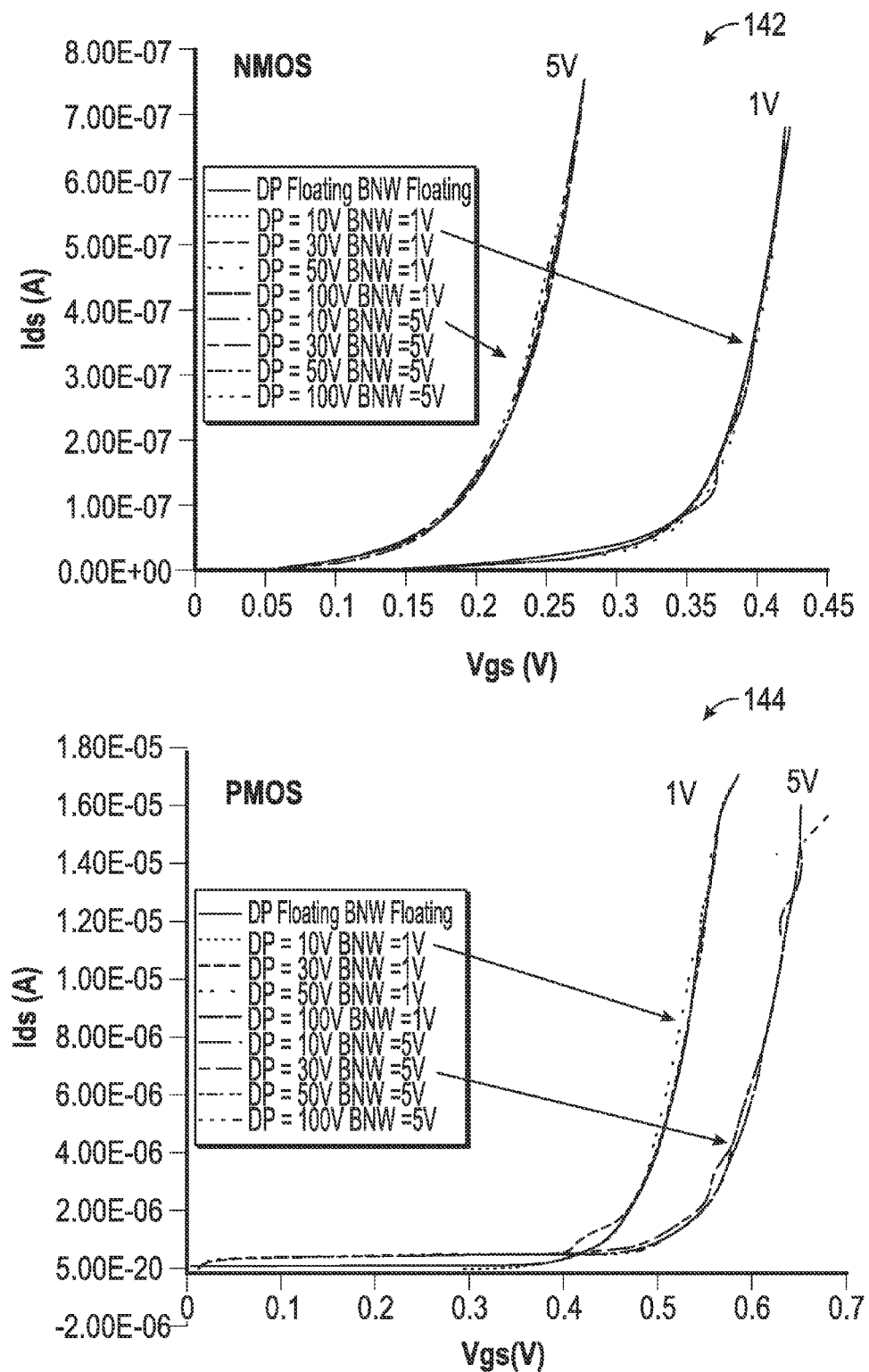
FIG. 9 illustrates graphs depicting data indicative of the measurements of efficiency of shielding of transistors by the nested BPW-BNW wells structure, input characteristics of a NMOS and PMOS transistors at the varied detector bias for two polarization voltages applied to BNWs.

Example input characteristics measured for one NMOS and one PMOS transistor are shown in FIG. 9. The detector reverse bias was varied from 10V to 100V and no change of the transistor current was observed. However, as it was expected, varying the DC potential of the BNW implant, the characteristics were shifted by the amount equal to the modified threshold voltage. The measurements showed that the back-gating effect is not present for transistors placed over the nested well structures.

Figure 10:
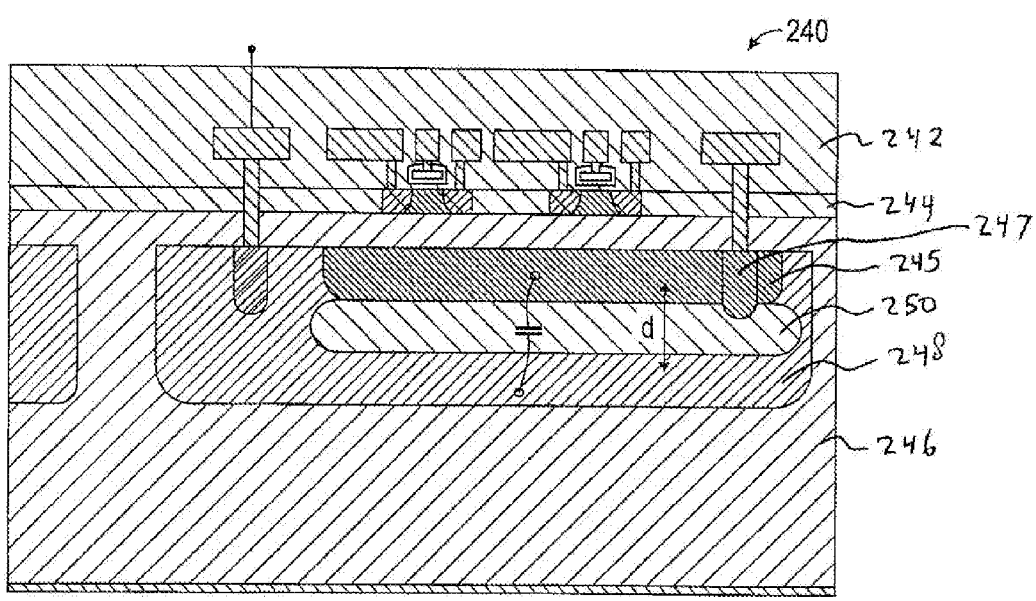
FIG. 10 illustrates a schematic diagram depicting the development of improved shielding by deeper implantation of BPW, in accordance with a preferred embodiment.

FIG. 10 illustrates a schematic diagram 240 depicting the development of improved shielding by deeper implantation of BPW, in accordance with the preferred embodiment. Layer(s) 242 shown in FIG. 10 comprise aggregated layers of dielectric material constituting isolation between metallization layers used for interconnections in the detector processing circuit. Layer 244 depicted in FIG. 10 comprises a layer (thin) of silicon used for building transistors. Layer 245 shown in FIG. 10 is a shallower well BPW (in case of n-type detector material) or BNW (in case of p-type detector material). Layer 246 shown in FIG. 10 is an n(p) type material of the detector that is the source of charge signals collected by the detector diodes electrodes after full or partial depletion. Layer 247 shown in FIG. 10 is a high concentration doping region for ohmic contacts establishing electrical connection to shallower well (i.e., BNW in case of n-type detector material and BPW in case of p-type detector material). Layer 348 comprises a deeper well of nested wells (e.g., BPW in the case of an n-type detector material or BNW in the case of a p-type detector material). Layer 250 shown in FIG. 10 is the depletion volume of the junction of nested BPW-BNW wells.

The next steps in the development of improved implementation of the shielding include studies to allow increasing separation between BNW and BPW. This can be achieved by increasing depth of implantation of the BPW (deeper well in a general case) region simultaneously with improved side-wall isolation. The minimization of junction capacitance is shown in FIG. 10.

It can be appreciated that a number of goals and requirements should be considered when implementing embodiments. First, it is preferred that a BNW layer (shallower well) is enclosed completely inside a structure of BPW (deeper well) to provide a low resistance path that shunts capacitive couplings between the electronics on top of the BOX to the detector layer underneath the BOX. Second, assuming N-type material for the active (depleted) volume of the detector, the charge collecting electrode is BPW and BNW shields the BPW from interferences from the electronics. Third, assuming N-type material for the detector, the BNW must be separated from the detector volume by a P-layer (BPW) to avoid electrical shorts (e.g., the back-side of the detector can be biased at a high positive voltage and the BNW can be kept at a low positive voltage). Note that side walls using multiple P-type implantations must be created.

Fourth, the effective thickness of the BNW (i.e., derived from the net N-type concentration underneath the BOX) can be such that effective resistance of the shield is kept reasonably small. The depth of doping, actually thickness of a doped layer, and concentration of donor species in it are the two parameters defining this resistance. Assuming the pixel size of 100×100 $\mu m^2$ (that is a round number but also is representative for pixel detectors for HEP or X-ray imaging), a designer may choose placing multiple contacts to the BNW region in order to decrease the resistance of the shielding layer underneath the BOX.

In some embodiments, it is preferred that the shielding BNW well be enclosed by opposite doping BPW regions in order to avoid shorting connections to the n-type detector volume. To achieve this enclosure, additional acceptor implants around the BNW region are performed. These implants should preferably reach the buried BPW. Two implants at different energies (e.g., two implants or in general even more implants done at various energies may be used to push BPW enclosures even deeper) may be required in order to achieve this job: the first at, for example, 0.5e12 $cm^{-2}$ and 240 keV, the second at, for example, 0.1e12 $cm^{-2}$ and 120 keV.

Figure 11:
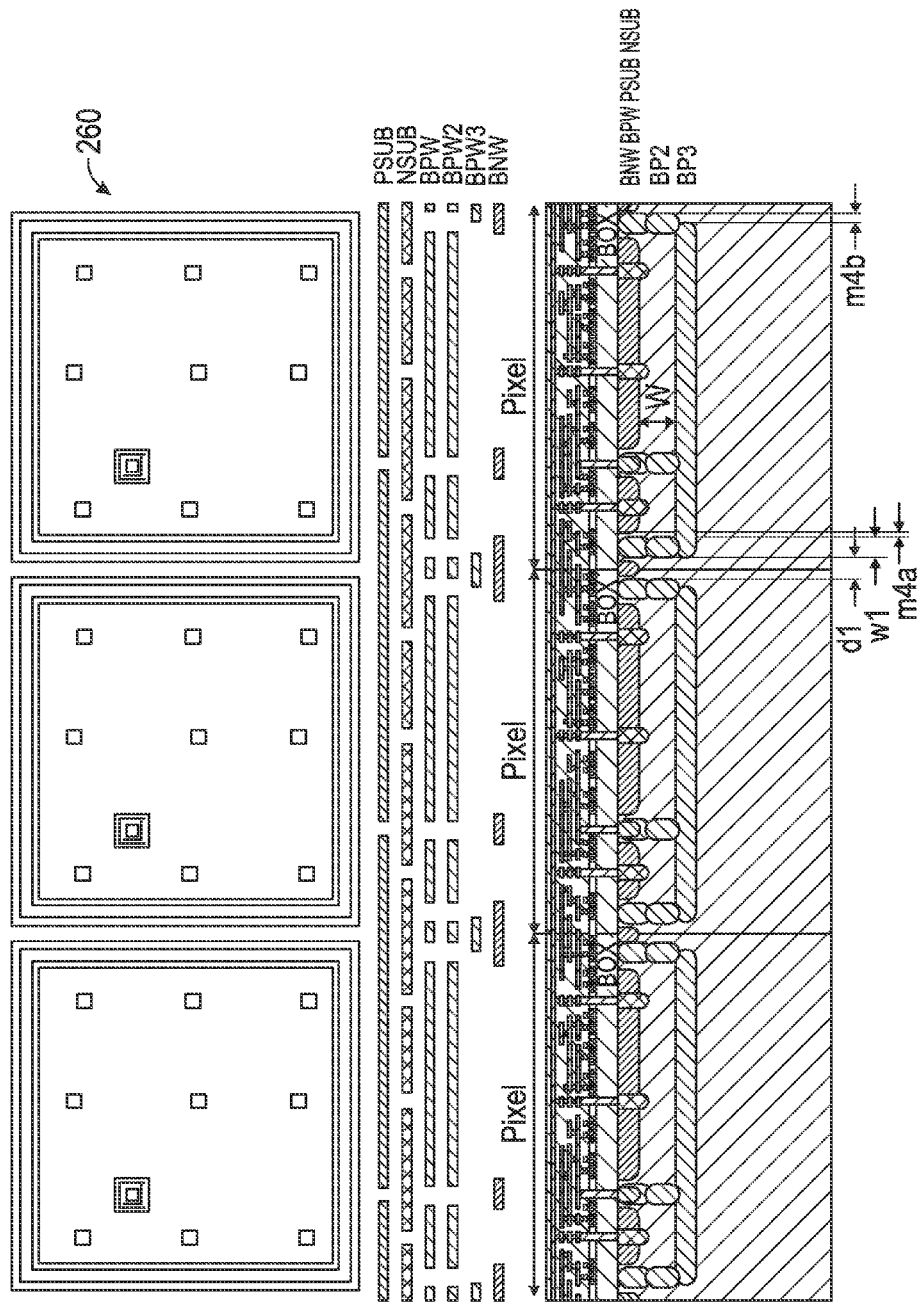
FIG. 11 illustrates a diagram depicting a design of a single pixel and a group of pixels forming a matrix following the nested well concept disclosed herein.

The structure exploiting the idea of nested wells is shown in FIG. 11, which depicts the construction of a pixel and segmentation of an imaging array into pixels. In general, FIG. 11 illustrates constructions of a pixel and segmentation of an imaging array, and a technique of using multiple contacts for BNW to achieve efficient shielding by lowering spread resistance to ground from any point on the BNW plane. FIG. 11 further demonstrates an exemplary sketch of masks (light masks) for implantations of various regions, along with a technique involving the use of contacts for transferring collected charge to the electronics located on top of BOX and distances that need to be specified in the design manual for guidance of mask layout design.

FIG. 11 generally depicts the use of multiple contacts for BNW to achieve efficient shielding by lowering spread resistance to ground from any point on the BNW plane. FIG. 11 is also an exemplary sketch of masks (light masks) for implantations of various regions. In addition, FIG. 11 demonstrates the use of contacts for transferring collected charge to the electronics located on top of BOX, and distances that should be specified in the design manual for guidance of mask layout design. FIG. 11 also depicts multistage implantations for enclosing walls.

The BNW may feature multiple contacts (NSUB) for lowering resistance of the closing path for capacitive couplings, the contact to the amplifier (PSUB) can be located in the middle of the pixel (requiring traversing through the BNW) or can use the implants enclosing the BNW. FIG. 11 thus illustrates a schematic diagram 260 depicting the design of pixels with the nested well concept disclosed herein.

In some embodiments, rules for critical dimensions can be specified as follows:
a. d1—distance between adjacent BPW/BP2/BP3—to avoid shorts of BPW regions from adjacent pixels
b. w1—width of BPW/BP2
c. m4a—minimum distance between BPW/BP2 and BNW
d. m4b—maximum distance from external edge of BP3 to edge of BP2 allowing continuity of the p-type region.

It can be appreciated that this is not an exhaustive list; this is a guideline for extending design rules of the process related to adding nested wells.

Based on the foregoing, it can be appreciated that the disclosed embodiments provide a new monolithic active pixel radiation detector. The detector can be fabricated in a Silicon-on-Insulator process with a thin Silicon layer that is used for building of the front-end electronic circuits. The electronic channels are connected to sources of signals located in a bulk part of a wafer, which involves flow of signals through electrically conducting vias established in the isolation oxide. The essence of the invention is an introduction of a structure of nested wells that has a triple role: first, a role of collection of charge carriers released in interaction with radiation; second, a role of assurance of separation of two closely spaced regions, i.e. the electronics and the sensor part one from each other; and third, a role for improving radiation hardness by decreasing trapping of charge in BOX.

This approach offers an efficient way of extending a standard process of fabrication of integrated circuits on SOI wafers with a high-resistivity bulk layer for building monolithic pixel detectors. It should be noted that one advantage of the present invention is that it can provide a highly desirable minimum effort required to the adaptation of a process for the fabrication of integrated circuits in order to obtain an efficient radiation detector. Another advantage is the use of thick SOI shielding as a method that provides enhanced performance but modifies the process to a larger degree.

The use of the disclosed embodiments allows retaining all steps of fabrication of electronics unchanged with respect to the original process. By this means, processing of monolithic radiation detectors and standard electronics is achievable on the same process line. The only difference consists in addition of a few implantation steps and establishing of contacts through the isolation oxide. The technology of monolithic pixel detectors fabricated with nested wells is applicable for position sensitive detectors, intensity radiographic imaging detectors and timing and energy spectroscopic detectors in High Energy and Nuclear Physics, Photon Science, Material Science, Nuclear Medicine, etc.

The nested wells are a respective pair of a deep Buried P(N)-type Well BPW(BNW) implanted in a handle part of a Silicon-on-Insulator (SOI) process wafer to collect charge carriers, and a shallow Buried N(P)-type Well BNW(BPW) nested by implantation inside the first well to inhibit capacitive coupling between the electronics and the sensor part. Depending on the type of bulk conductivity, execution of nesting of wells may be interchanged, i.e. BNW in BPW or BPW in BNW. On an N-type sensor, BPW and BNW are deep and shallow implantations, respectively. On a P-type sensor, implants are reversed.

This feature is marked by appropriately, interchangeably placing the names of wells in parentheses in the earlier text. The goal for nested wells is to achieve decoupling of the electronics and charge sensing region of a detector. Buried Oxide (BOX) and BPW, being originally the only isolation in monolithic pixel sensors, which were realized so far in SOI processes, is not enough. The volume of the sensor is filled with electric field that is induced between the backplane of a sensor and an array of deep wells. The shallow wells are placed just under the BOX and they form an array of AC-ground planes tied to a fixed potential in operation of a detector. Thus, the back-gate effect on transistors in the electronic circuits is suppressed, no interference is transmitted from the electronics to the sensors active volume, resistance to ionizing radiation of the device is increased by assuring virtually no electric field in the BOX region, and the full volume of the detector can be operated in depletion.

The deep well, responsible for charge collection, is implanted using sufficient energy of the implanter to create a peak of concentration deeply in the sensors as far from the BOX as achievable. The depth of implantation is chosen in such a way that too large lateral spread of the doping is avoided. Fulfilling of the latter condition is necessary in order not to compromise isolation of adjacent charge collecting electrodes. The deep implantation of the charge collecting electrode leaves net doping concentration at the BOX boundaries unchanged.

Selection of exact values of energies for ion implantations obviously needs to be specified in a given process rules to allow designing of masks. However, due to the general aspect of the invention, the energies need not be exactly specified in the definition of the invention. Their choice only has to take into account optimization of the structure of the detector in the context related to a particular application. The shallow implantation of the shielding well requires formation of the encompassing walls of the same type as the deep implant in order to avoid shortening of shallow wells to the sensor bulk as the nested well is of the same conductivity type as the bulk. The junction isolation walls, embracing tightly the shallow well, result from multi-step implantations at varied energies that decrease towards the surface.

Typically two or three selective implantation steps may be required to enclose the shallow wells by the deep wells. Note that in some embodiments, additional steps can be implemented to precisely define the walls. That is, more steps may be employed to construct the sidewalls. In any event, the implantations, used for establishing enclosures of the shallow wells can be used for assuring connections between the electronics in the silicon layer on top of the BOX and the charge collecting electrodes (deep wells). Such contacts, however, do not have to be in the walls. These contacts can be added in the center of the structures, like it is shown in FIG. 11. Connections to the deep and shallow wells are established by fabricating through BOX contacts filled with metal. Thick SOI on top of BOX does not result in sharing anything with nested wells, but this configuration is ideal for achieving a reliable detector with shielding. This feature is discussed in greater detail below with respect to FIGS. 12, 13, and 14.

Figure 12:
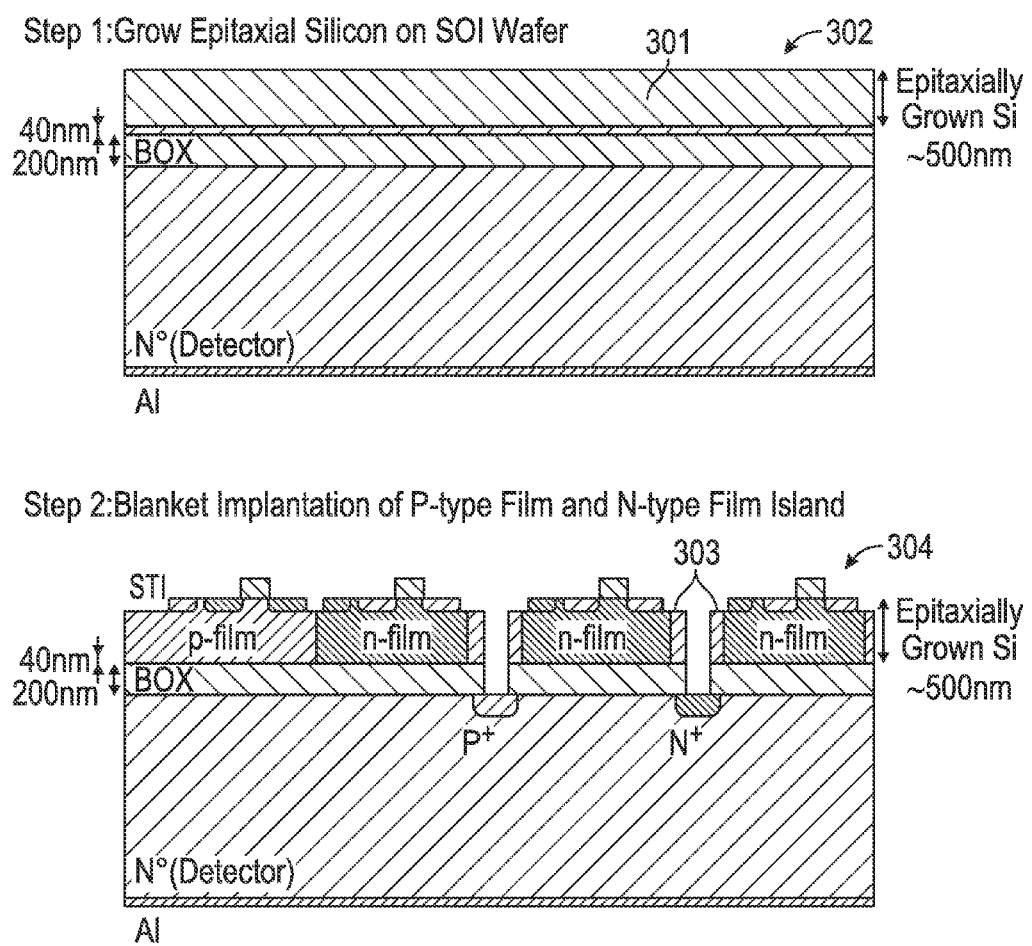
FIGS. 12, 13, and 14 illustrate the separation of the detector layer from the sensor bulk, in accordance with an alternative embodiment.
Figure 13:
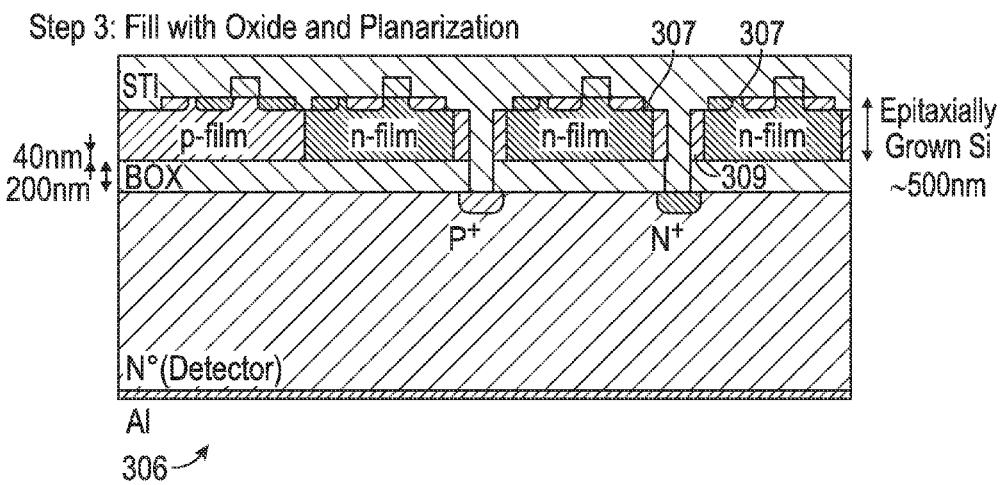
Figure 14:
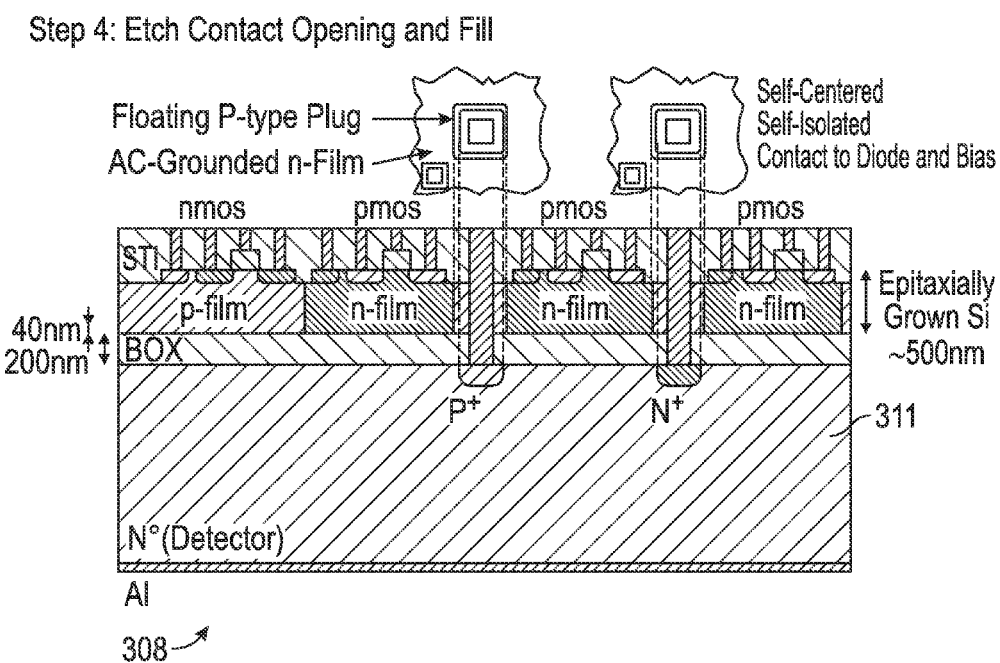

FIGS. 12, 13, and 14 illustrate processing steps of the simplified process flow to achieve separation of the detector layer from the sensor bulk, in accordance with an alternative embodiment. The methodology shown in FIGS. 12, 13, and 14 is not based on the nested wells concept discussed previously herein. Instead, the approach shown in FIGS. 12, 13, and 14 uses a thick silicon layer that opaquely seats on top of BOX. The methodology depicted in FIGS. 12, 13, and 14 can be considered as another concept of shielding.

FIG. 12 illustrates a first step 302 involving growth of epitaxial silicon on a thin SOI wafer. In some embodiments, the wafer with an already thick silicon layer or other method of increasing its thickness can be used, that is, it does not have to be epitaxial growth to achieve thick Silicon layer on top of the BOX. The grown layer 301 can be used for the substrate for transistors. It is preferred, however, that no isolation of transistor islands be implemented in order to achieve proper screening.

FIG. 12 further illustrates a second processing step 304 in which implantation of a P-type film and N-type film islands are implemented. Note that in one possible scenario, one may assume blanket implantation of one type, for example, P-type and then selective implantation—type inversion—of N-type islands. Another possibility involves the definition of a substrate type during epitaxial growth and then changing of the type for islands to the second type. It is important that the P-type film 303, for example, is left around cuts and is fully enclosed by an N-type film for self-centering and for junction-type isolation of contacts. In a third processing step (not shown) cuts of contact holes, source and drain transistors implants, and cuts of field oxide or trench isolations for these transistors can be implemented. Note that in the embodiment of FIGS. 13-15, an N-type detector is preferred. Transistors will be closer to the bulk devices (e.g., each N and P type island will be fully isolated and all islands will be AC-grounded).

FIG. 13 illustrates a fourth processing step 306 involving filling with oxide and planarization. Islands 307a hosting PMOS transistors and 307b hosting NMOS transistors have contacts for grounding. Additionally, P-type film areas 309, for example, are left around the openings and are left electrically floating. After etching openings for sources and drains of transistors and polysilicon gates and diodes, it will not be needed to passivate walls, having exposed P-type silicon with any oxide. Isolations will be achieved through junctions. After this step, all processing will be the same as it was for the original process. FIG. 14 illustrates a fifth processing step 308 involving an etch of a contact opening and metal fill operation. Etching of a contact opening such as contact opening 311, for example, is self-centered and the metallic fill material will be in contact with P-type material, but the second diode terminal will be grounded. The contact between the fill metal and the floating P-type material may result in some extra capacitance. However, it should be small capacitance and should not have meaningful influence on amplifiers with virtual ground at the input.

The methodology shown in FIGS. 12, 13, and 14 thus offers a thick isolation processing technique based on the use of thick silicon on top of a high resistivity handle wafer. The detector created according to this technique uses a thick layer directly from the vendor or it can be grown epitaxially or by other means. A blanket implantation can be performed of one type or a doping of one type can be achieved during epitaxial growth (doping sufficient to implement one type of transistor). Other steps involve the implantation of one or more islands by converting the conductivity type to embed transistors of the second type in these islands. Some areas of the first type can be left around places for contacts (to be cut) to establish connections to the diodes in the substrate.

Additionally, doping of islands of the second conductivity type can be performed in such a manner that every contact through isolation oxide to sources of signals is encircled by thus created junction to form isolation of contacts. Other processing steps involve performing cuts of contacts and implantation within cavities (e.g., starting with thin silicon implants of collecting junctions before epitaxial growth). Cavities can be filled with metal establishing ohmic contacts to charge collecting junctions and flow of signals to the electronics. Electronics can be configured with, for example, partially depleted SOI transistors or literally bulk-like behaving transistors.

Based on the foregoing, it can be appreciated that a number of embodiments, alternative and preferred, are disclosed herein. For example, in one embodiment, a monolithic active pixel radiation detector is disclosed. Such a detector can include, for example, a substrate comprising a silicon layer upon which electronic circuits are configured, a plurality of channels formed on the silicon layer, wherein the plurality of channels are connected to sources of signals located in a bulk part of the substrate, wherein the signals flow through electrically conducting vias established in an isolation oxide on the substrate, and one or more nested wells configured from the substrate, wherein the well(s) assist in a collection of charge carriers released in interaction with radiation and wherein the nested well(s) further separates the electronic circuits from a sensing portion of the substrate.

In another embodiment, the nested well(s) can include a first well that assists in the collection of charge carriers, and wherein the nested well(s) further comprises a second well nested by implantation within the first well to inhibit capacitive coupling between the electronic circuits and the sensing portion. In another embodiment, the first well can include a deep buried P(N)-type well implanted in a handle portion of a SOI process wafer comprising the substrate. In yet another embodiment, the second well can include a shallow well. In still another embodiment, the shallow well can include a shallow buried N(P)-type well.

In another embodiment, the nested well(s) can include a first well that includes a deep buried P(N)-type well implanted in a handle portion of a SOI process wafer comprising the substrate to assist in the collection of charge carriers, and wherein the nested well(s) further comprises a second well comprising a shallow buried N(P)-type well nested by implantation within the first well to inhibit capacitive coupling between the electronic circuits and the sensing portion.

In another embodiment, a buried oxide can be configured from the substrate wherein the shallow well is located beneath the buried oxide and comprises an AC-ground plane that is tied to a fixed potential. In yet another embodiment, a multi-layer isolation of walls can be achieved through multiple implantations at different energies or at different energies and different doses, wherein the deep well comprises a deep buried P(N)-type well that minimizes parasitic BNP/BNW junction capacitance. In still another embodiment, a multi-layer isolation of walls can be achieved through multiple implantations at different energies or at different energies and different doses, wherein the deep well comprises a deep buried P(N)-type well that minimizes parasitic BNP/BNW junction capacitance.

In another embodiment, a method of configuring a monolithic active pixel radiation detector can be implemented. Such a method can include the steps of, for example, providing a substrate comprising a silicon layer upon which electronic circuits are configured forming a plurality of channels on the silicon layer, connecting the plurality of channels to sources of signals located in a bulk part of the substrate, wherein the signals flow through electrically conducting vias established in an isolation oxide on the substrate, and configuring one or more nested wells from the substrate, wherein the nested well(s) assists in a collection of charge carriers released in interaction with radiation and wherein the nested well(s) further separates the electronic circuits from a sensing portion of the substrate.

In another embodiment, a step can be provided for configuring the nested well(s) to comprise a first well that assists in the collection of charge carriers, and wherein the nested well(s) further comprises a second well nested by implantation within the first well to inhibit capacitive coupling between the electronic circuits and the sensing portion.

In yet another embodiment, steps can be provided for configuring the nested well(s) to comprise a first well that includes a deep buried P(N)-type well implanted in a handle portion of a SOI process wafer comprising the substrate to assist in the collection of charge carriers, and configuring the nested well(s) to comprise a second well comprising a shallow buried N(P)-type well nested by implantation within the first well to inhibit capacitive coupling between the electronic circuits and the sensing portion.

In another embodiment, a thick SOI radiation detector can be implemented. Such a detector can include, for example, a high resistivity wafer substrate with a thick silicon layer configured thereon, one or more blanket implanted islands in the silicon layer on top of the high resistivity wafer substrate to form locations for a first transistor type, one or more second islands of an opposite type with respect to the first island, a second transistor type embedded in the island(s) of the opposite type, and connections to diodes established in the high resistivity wafer substrate to thereafter implement detector electronics and shielding thereof.

In another embodiment, a bulk of the first transistor type can be configured by blanket implantation of one doping type or achieved during an epitaxial growth. In still another embodiment, at least some areas of a first doping type can be left without transistors for contacts to be cut to establish the connections to the diodes in the high resistivity wafer substrate. In yet another embodiment, the one or more islands can be doped with respect to a second doping type in such a manner that every contact through isolation oxide and the silicon layer thereon to sources of signals is encircled by junction to form isolation of contacts.

In another embodiment, implantation within cavities can be performed beginning with thin silicon layer prior to epitaxial growth. In yet another embodiment, cuts of the contacts leading to cavities are subsequently capable of being filled with metal later through the thick silicon layer on top of the isolation oxide inside of the contact isolation junctions. In still another embodiment, the cavities can be filed with metal to establish ohmic contacts for collecting junctions and a flow of signals to the detector electronics. In another embodiment, the first transistor type and the second transistor type can constitute partially depleted SOI transistors or bulk-like behaving transistors.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art, which are also intended to be encompassed by the following claims.

What is claimed is:

1. A monolithic active pixel radiation detector, comprising:
   a substrate comprising a silicon layer upon which electronic circuits are configured;
   a plurality of channels formed on said silicon layer, wherein said plurality of channels is connected to sources of charge signals, wherein a source of said charge signals among said sources of charge signals is biased entirely or partially in depletion in a high-resistivity bulk layer of said substrate, wherein said charge signals are collected by implanted electrodes and flow through electrically conducting vias established in an isolation oxide on said substrate;
   at least one first nested well, implanted deep and configured from said substrate, wherein said at least one first nested well comprises a signal collection electrode assists in a collection of charge carriers released in interaction with radiation and wherein at least one second nested well, implanted shallower and entirely confined in said at least one first nested well, so as to separate said electronic circuits from a sensing portion of said substrate, wherein said at least one second nest well comprises a shallow well; and
   a buried oxide configured from said substrate wherein said shallow well is located beneath said buried oxide and is entirely electrically isolated through confinement inside said at least one first nested well and comprises an AC-ground plane that is tied to a fixed potential.

2. The detector of claim 1 wherein said at least one first nested well comprises a first well that assists in said collection of charge carriers, and wherein said at least one second nested well further comprises a second well nested by implantation within said first well to inhibit capacitive coupling between said electronic circuits and said sensing portion and wherein said at least one second nested well encompasses said electronic circuits such that no part of said electronic circuits, except wiring, lies out of said at least one second nested well nor directly over any part of said high-resistivity bulk layer of said substrate.

3. The detector of claim 2 wherein said first well comprises a deep buried P(N)-type well implanted in a handle portion of an SOI process wafer comprising said substrate.

4. The detector of claim 2 further comprising a multi-layer isolation of walls achieved through multiple implantations at different energies or at different energies and different doses, leading to entire electrical isolation through confinement inside said deep well wherein said deep well comprises a deep buried P(N)-type well that implanted deeply minimizes parasitic said deep well to said shallow well (BNP/BNW) junction capacitance.

5. The detector of claim 1 wherein said shallow well comprises a shallow buried N(P)-type well.

6. The detector of claim 1 wherein said at least one first nested well comprises a first well that includes a deep buried P(N)-type well implanted in a handle portion of an SOI process wafer comprising said substrate to assist in said collection of charge carriers, and wherein said at least one second nested well further comprises a second well comprising a shallow well comprising a buried N(P)-type well nested by implantation within said first well to inhibit capacitive coupling between said electronic circuits and said sensing portion.

7. The detector of claim 1 further comprising a multi-layer isolation of walls achieved through multiple implantations at different energies or at different energies and different doses, wherein said multi-layer isolation is electrically connected to said deep well and wherein said deep well comprises a deep buried P(N)-type well that minimizes parasitic said deep well to said shallow well (BNP/BNW) junction capacitance.

8. A method of configuring a monolithic active pixel radiation detector, said method comprising:
   providing a substrate comprising a silicon layer upon which electronic circuits are configured;
   forming a plurality of channels on said silicon layer;
   connecting said plurality of channels to sources of charge signals, wherein a source of said charge signals is biased entirely or partially in depletion in a high-resistivity bulk layer of said substrate, wherein said charge signals are collected by implanted electrodes and flow through electrically conducting vias established in an isolation oxide on said substrate; and
   configuring at least one first nested well, implanted deeper, from said substrate, wherein said at least one first nested well comprises a signal collection electrode assisting in a collection of charge carriers released in interaction with radiation and wherein at least one second nested well, implanted shallower and entirely confined in said at least one first nested well, further separates said electronic circuits from a sensing portion of said substrate.

9. The method of claim 8 further comprising configuring said at least one first nested well to comprise a first well that assists in said collection of charge carriers, and wherein at least one second nested well comprises a second well nested by implantation within said first well to inhibit capacitive coupling between said electronic circuits and said sensing portion and said at least one second nested well encompasses said electronic circuits such that no part of said electronic circuits, except wiring, lays out of said at least one second nested well nor directly over said any part of said high-resistivity bulk layer of said substrate.

10. The method of claim 8 further comprising:
   configuring said at least one first nested well to comprise a first well that includes a deep buried P(N)-type well implanted in a handle portion of an SOI process wafer comprising said substrate to assist in said collection of charge carriers;
   configuring said at least one second nested well to comprise a second well comprising a shallow buried N(P)-type well nested by implantation within said first well to inhibit capacitive coupling between said electronic circuits and said sensing portion; and configuring a multi-layer isolation of walls achieved through multiple implantations at different energies or at different energies and different doses, leading to entire an electrical isolation through confinement inside said deep well.

* * * * *